United States Patent [19]

Yagi et al.

[11] Patent Number: 5,309,316
[45] Date of Patent: May 3, 1994

[54] TERMINAL STRUCTURE OF FLEXIBLE PRINTED CIRCUIT BOARD

[75] Inventors: Nobuyuki Yagi, Tokyo; Yasutoshi Kaku, Kanagawa, both of Japan

[73] Assignee: Teikoku Tsushin Kogyo Co., Ltd., Kanagawa, Japan

[21] Appl. No.: 952,268

[22] Filed: Sep. 28, 1992

[30] Foreign Application Priority Data

Sep. 27, 1991 [JP] Japan .................. 3-276885
May 8, 1992 [JP] Japan .................. 4-143359

[51] Int. Cl.[5] ........................... H05K 1/00
[52] U.S. Cl. ................... 361/749; 174/260; 257/692; 439/44; 361/774; 361/791
[58] Field of Search ........... 361/393, 397, 398, 400, 361/404–409, 413, 395, 399, 420, 421; 174/52.1, 255, 257, 260; 257/666, 678, 690, 692, 696; 439/44, 43, 55, 67, 77

[56] References Cited

U.S. PATENT DOCUMENTS

| | | |
|---|---|---|
| 4,044,460 | 8/1977 | Schachter . |
| 4,188,714 | 2/1980 | Nashua . |
| 4,900,268 | 2/1990 | Kunishi . |
| 5,047,895 | 9/1991 | Sasaki ............ 361/398 |
| 5,111,363 | 5/1992 | Yagi et al. ......... 361/398 |
| 5,121,297 | 6/1992 | Haas ............. 361/398 |

FOREIGN PATENT DOCUMENTS

272707 6/1988 European Pat. Off. .

Primary Examiner—Leo P. Picard
Assistant Examiner—Y. Whang
Attorney, Agent, or Firm—Wenderoth, Lind & Ponack

[57] ABSTRACT

A terminal structure includes a portion of a flexible printed circuit board and a plurality of metal terminals each consisting of a slender, elongate metal plate. The circuit board has a plurality of electrically conductive patterns provided on a resin film, a prescribed portion of the board having a connector insertion portion of a width substantially the same as that of an insertion hole of a connector. The plurality of metal terminals are placed in parallel on the flexible printed circuit board in such a manner that distal ends thereof are situated adjacent a distal end of the connector insertion portion, and each metal terminal is fixedly bonded to a respective one of the electrically conductive patterns provided on the flexible printed circuit board. The width of the connector insertion portion of the flexible printed circuit board to which the metal terminals have been attached is such that the connector insertion portion will not extend beyond the outer sides of the two outermost metal terminals on the longitudinal side edges of the connector insertion portion.

4 Claims, 9 Drawing Sheets

TERMINAL STRUCTURE OF FLEXIBLE PRINTED CIRCUIT BOARD

BACKGROUND OF THE INVENTION

1. Field of the Invention

This invention relates to the terminal structure of a flexible printed circuit board, wherein the terminal is ideal for connection to a miniaturized connector.

2. Description of the Prior Art

Electronic parts of a wide variety have recently been reduced in size and thickness, and this has been accompanied by the widespread use of flexible printed circuit boards designed to make effective utilization of available space. A flexible printed circuit board of this kind is obtained by forming electrically conductive patterns on a flexible insulating film.

Figure 9:
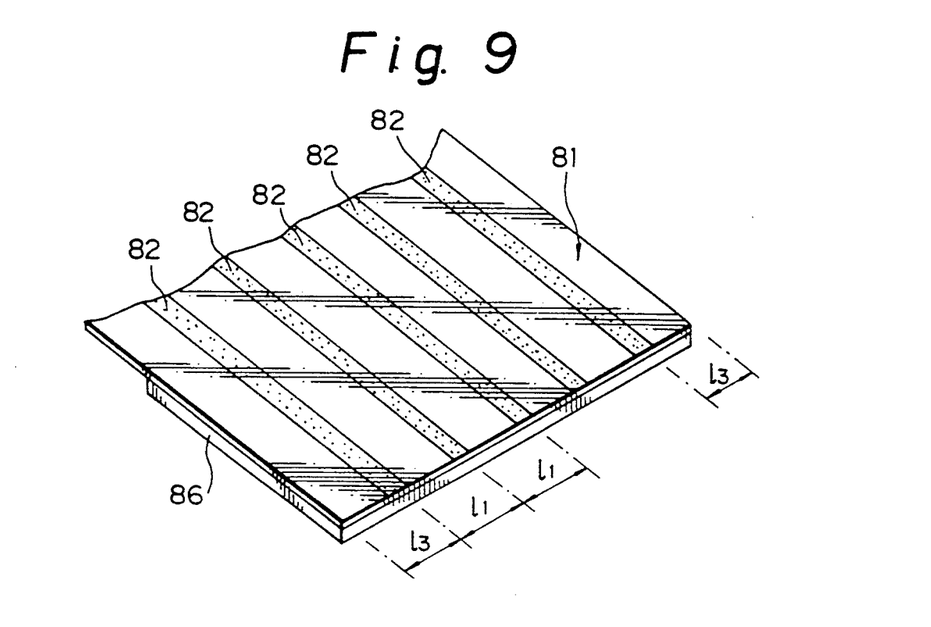
FIG. 9 is a perspective view showing the terminal structure of a flexible printed circuit board according to the prior art.

In order to connect a flexible printed circuit board to the connector of an electronic part, a portion of one edge of a flexible printed circuit board 81 that is provided with electrically conductive patterns 82 is directly inserted into a connector, as illustrated in FIG. 9.

Figure 10A:
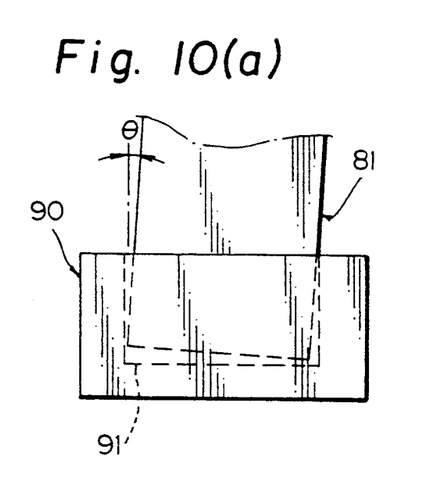
FIGS. 10(a)–10(b) is a schematic view illustrating a method of connecting a flexible printed circuit board to a connector.
Figure 10B:
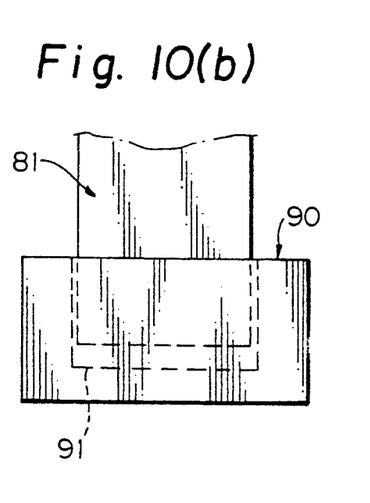

Since the flexible printed circuit board 81 consists of a thin film and exhibits flexibility, it has little strength. Therefore, in a case where the flexible printed circuit board 81 is directly inserted into a connector 90 (FIG. 10), a rigid resin base 86 for reinforcement is bonded to the underside of the flexible printed circuit board 81, as shown in FIG. 9.

The recent progress that has been made in miniaturizing devices has been accompanied by miniaturization of the connectors used to connect the flexible printed circuit board 81. In order to accommodate such miniaturized connectors, it is necessary to reduce the spacing between the electrically conductive patterns 82 shown in FIG. 9. With such an expedient, however, certain problems arise, which will now be described.

(1) In order to manufacture the flexible printed circuit board 81, the electrically conductive patterns 82 are formed on a large resin film by etching or screen printing, after which the resin film is subjected to cutting. As a result, a spacing $l_1$ of the electrically conductive patterns 82 can be rendered constant with good accuracy, as shown in FIG. 9, however, owing to a mechanical error which develops when the resin film is cut, a deviation is produced in spaces $l_3$, $l_3$ between both side edges of the flexible printed circuit board 81 and the outermost electrically conductive patterns 82 (that is, $l_3 \neq l_3$ is the result of the aforementioned mechanical error). When this deviation occurs in the spaces $l_3$, $l_3$ the electrically conductive patterns 82 cannot be accurately connected to the respective connection terminals inside the connector even if the flexible printed circuit board 81 is accurately inserted into the insertion hole of the connector. The more the spacing of the electrically conductive patterns 82 is narrowed, the more prominent this problem becomes. In certain cases, an electrically conductive pattern 82 which Is not intended to be connected may come into contact with a connection terminal inside the connector, thereby producing a short circuit.

(2) In order to smoothen the insertion of the flexible printed circuit board 81, a prescribed amount of play in the width direction is provided between the flexible printed circuit board 81 and the inner wall of the insertion hole of the connector. Consequently, when the flexible printed circuit board 81 is inserted into an insertion hole 91 of a connector 90, as illustrated in FIG. 10(a), there are cases where the flexible printed circuit board 81 fits into the insertion hole 91 askew at small angle $\theta$. If the spacing $l_1$ (see FIG. 9) between the electrically conductive patterns 82 is small in such case, there is the danger that an electrically conductive pattern 82 which Is not intended to be connected may come into contact with a connection terminal inside the connector 90, thereby producing a short circuit.

(3) When the flexible printed circuit board is inserted into the insertion hole 91 of the connector 90, there are cases where the insertion of the flexible printed circuit board 81 into the insertion hole 91 stops midway, as shown in FIG. 10(b). In other words, since there is no indication on the flexible printed circuit board 81 by which the amount of insertion can be determined, it may be misconceived that the two are perfectly connected when in fact they are not, in which case the two would remain in an imperfectly connected state.

SUMMARY OF THE INVENTION

The present invention has been devised in view of the foregoing problems and its object is to provide a terminal structure of a flexible printed circuit board wherein the electrically conductive patterns can be reliably connected to corresponding connection terminals inside a connector even if the spacing between the electrically conductive patterns is made small.

According to the present invention, the foregoing object is attained by providing a terminal structure of a flexible printed circuit board, comprising a plurality of electrically conductive patterns provided on a resin film, a prescribed portion of the resin film having a connector insertion portion of a width substantially the same as that of an insertion hole of a connector, and a plurality of metal terminals each consisting of slender, elongate metal plate, the plurality of metal terminals being placed in parallel on the flexible printed circuit board in such a manner that distal ends thereof are situated adjacent a distal end of the connector insertion portion of the flexible printed circuit board, each metal terminal being fixedly bonded to a respective one of the electrically conductive patterns provided on the flexible printed circuit board, and a width of the connector insertion portion of the flexible printed circuit board to which the metal terminals have been attached is made such that the connector insertion portion does not extend beyond the outer sides of two outermost metal terminals.

According to the present invention, the portions of the metal terminals on the leading-end side thereof to be inserted into the insertion hole of the connector are formed in such a manner that the spaces between mutually adjacent ones of the metal terminals at these portions will be rendered parallel and smaller than the spaces between mutually adjacent ones of the metal terminals at the portions on the trailing-end side thereof where they are fixedly bonded to the electrically conductive patterns. Furthermore, the outer sides of the outermost metal terminals are provided with respective corner portions for coming into abutting contact with and being positioned by both sides of an entrance to the insertion hole of the connector when the metal terminals are inserted into the insertion hole.

According to the present invention, prescribed metal terminals among the plurality of metal terminals are each provided with a longitudinally extending portion of comparatively large width and a longitudinally extending portion of comparatively small width, and the portions of comparatively large width are disposed in a staggered fashion and made to serve as surfaces of contact with respective ones of the connection terminals of the connector.

Since the metal terminal are placed in their entirety on the resin film and secured, the distal ends of the metal terminals can be readily inserted into the insertion hole of the connector without becoming misaligned.

Further, the metal terminals are cut by press-cutting in a state in which the distal ends thereof are connected together, and in this state the metal terminals can be affixed to the resin film. As a result, the spacing of the metal terminals can be fixed with good accuracy, and so can spaces from the outer side edges of the two outermost metal terminals on both longitudinal edges of the resin film to the metal terminals adjacent thereof. Moreover, since the outer side edges of the metal terminals on both longitudinal edges of the resin film serve directly as guides for insertion into the insertion hole of the connector, each metal terminal can be accurately connected to a respective one of the connection terminals in the connector when the metal terminals are inserted into the insertion hole.

The metal terminals on both longitudinal side edges are each provided with the corner portion. This makes it possible to insert the flexible printed circuit board straight into the connector at all times and assures that the amount of insertion will always be the proper amount.

Furthermore, since the highly rigid metal terminals themselves serve as guides for insertion into the insertion hole of the connector, the insertion operation is facilitated and made more reliable.

Further, because the portions of the metal terminals on the leading-end side thereof to be inserted into the insertion hole of the connector are formed in such a manner that the spaces between the metal terminals at these portions will be smaller than the spaces between the metal terminals at the portions on the trailing-end side thereof where they are fixedly bonded to the electrically conductive patterns, the spacing of the metal terminals on the side connected to the electrically conductive patterns can be enlarged, even if the connector is miniaturized. Accordingly, it is possible to make the connection to the miniaturized connector even though the metal terminals are connected to the flexible printed circuit board.

In the arrangement wherein the metal terminals are provided with the portion of large width and the portion and small width and these portions of the metal terminals are disposed in a staggered fashion, the area of contact with connection terminals of the connector can be enlarged, and therefore the dimensional precision of the metal terminals can be somewhat coarse. Conversely, if it is desired not to increase the contact area, the spacing of the metal terminals can be reduced.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 6(a)–6(e) show a method of connecting a flexible printed circuit board, to which the metal terminals have been secured, to a connector, in which FIG. 6(c), and FIG. 6(e) is a sectional view showing the flexible printed circuit board after it is inserted into the connector.

DETAILED DESCRIPTION OF THE PREFERRED EMBODIMENTS

Embodiments of the present invention will now be described in detail with reference to the accompanying drawings.

First Embodiment

Figure 1:
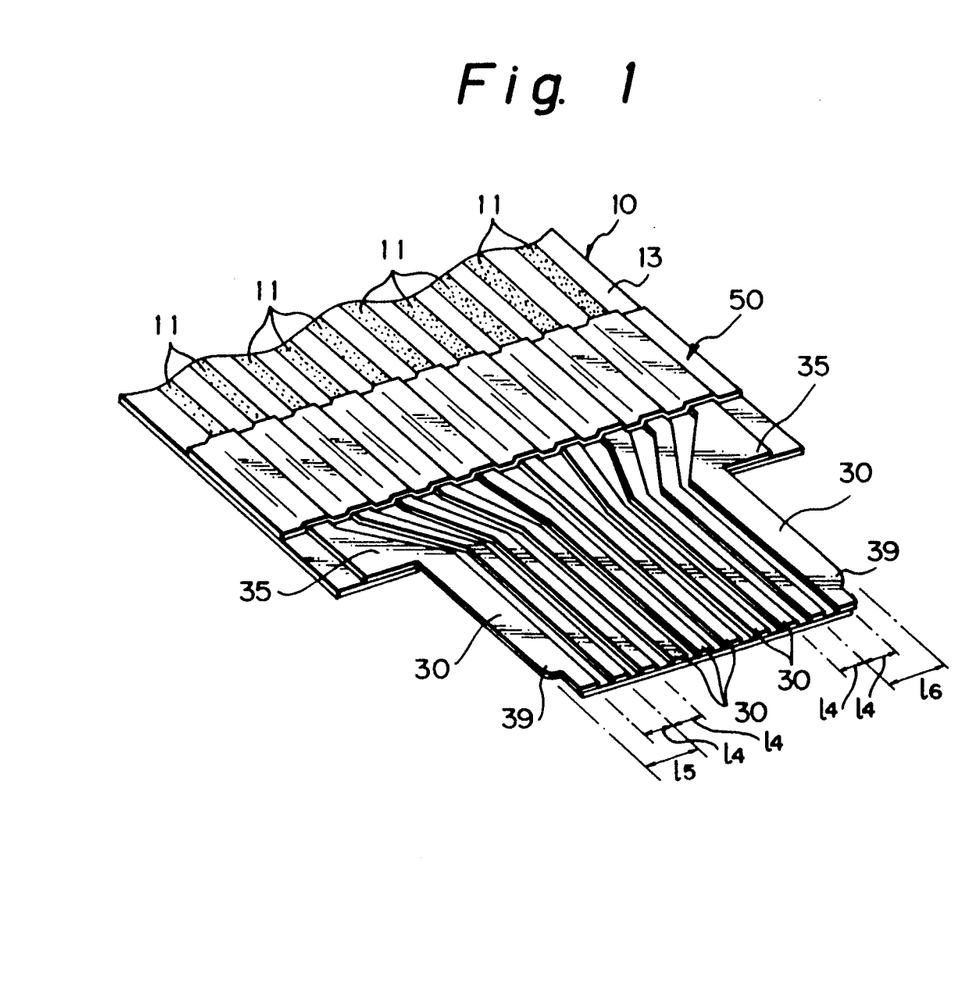
FIG. 1 is a perspective view showing the terminal structure of a flexible printed circuit board according to a first embodiment of the present invention.

FIG. 1 is a perspective view illustrating a terminal structure of a flexible printed circuit board according to a first embodiment of the present invention.

In the embodiment shown in FIG. 1, ten electrically conductive patterns 11 are provided on a flexible printed circuit board 10, and ten metal terminals 30 are connected to the end portions of respective ones of the electrically conductive patterns 11 using a reinforcing film 50.

Here the spaces between the metal terminals 30 on the leading-end side thereof (the portion to be inserted into a connector 70, described below) are formed so as to be parallel and smaller than the spaces between mutually adjacent ones of the metal terminals 30 at the portions on the trailing-end side thereof where they are fixedly bonded to the electrically conductive patterns 11. Further, a resin film 13 forming the flexible printed circuit board 10 is bonded to the entire underside of each of the metal terminals 30. Corner portions 35 extending outward at right angles are provided on the outer sides of the outermost metal terminals 30 of the ten metal terminals at the portions where the spacing between the metal terminals is narrowed.

Each of these component parts will now be described.

Figure 2:
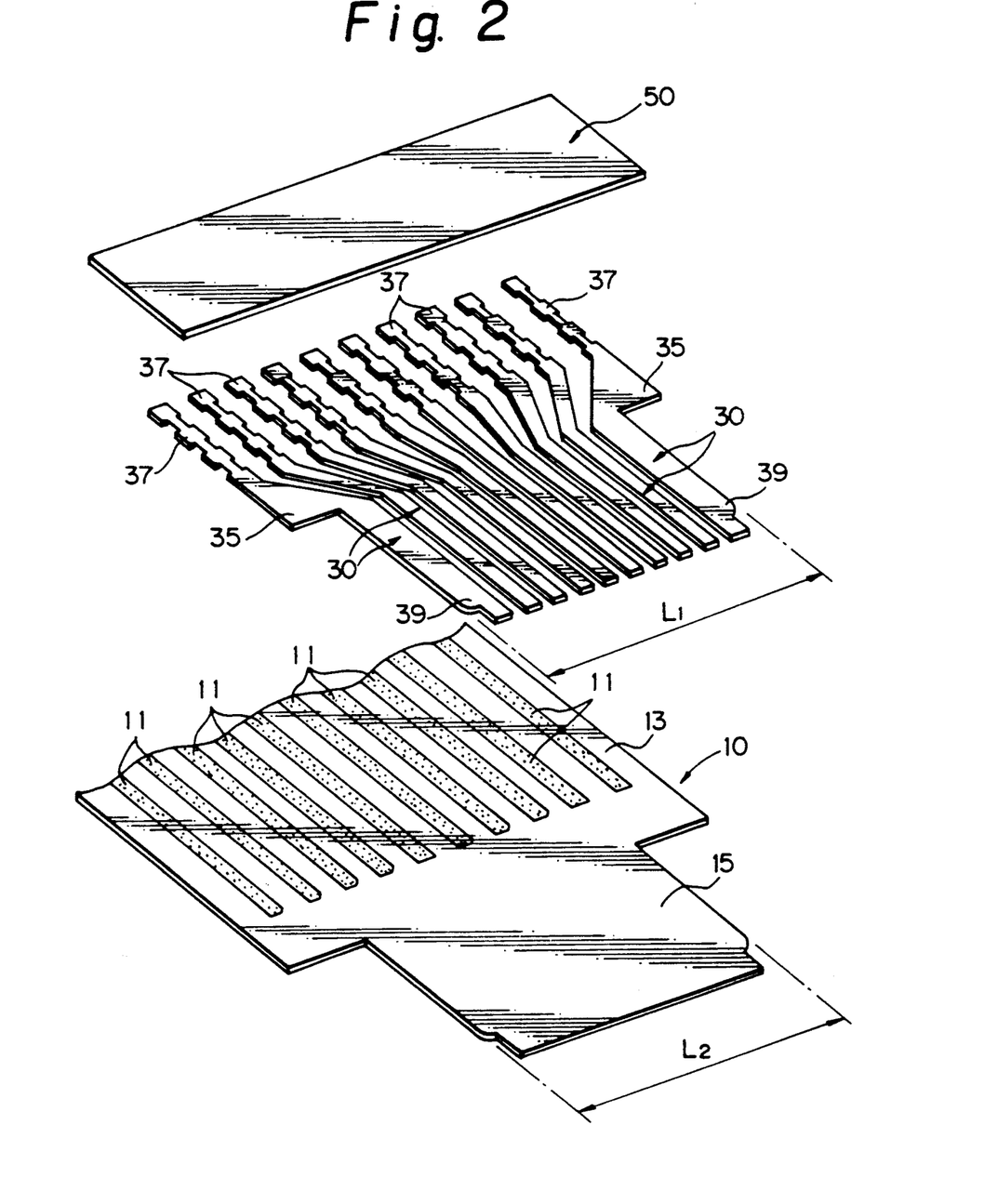
FIG. 2 is an exploded perspective view showing the terminal structure of the flexible printed circuit board illustrated in FIG. 1.

FIG. 2 is an exploded perspective view showing the terminal structure of the flexible printed circuit board depicted in FIG. 1.

As shown in FIG. 2, ten electrically conductive patterns 11 are provided in parallel on the flexible resin film 13, thereby constructing the flexible printed circuit board 10. The electrically conductive patterns 11 are formed by techniques such as by etching or screen printing. A tongue-shaped connector input portion 15 is provided on the terminus of the resin film 13. The connector input portion 15 is formed to have a shape and size approximately the same as the shaped and size of the distal end portion of all ten of the metal terminals 30 taken as a whole. The width $L_2$ of the connector end portion 15 is set to be slightly less than the width $L_1$ of all ten of the metal terminal 30 taken as a whole.

The ten metal terminals 30 are arranged in parallel rows. The trailing end of each metal terminal 30 is provided with a connection portion 37 having irregularly shaped side faces for connection to respective ones of the electrically conductive patterns 11. Each metal terminal 30 is formed in such a manner that the spaces between the metal terminals 30 from the central portions to the distal ends thereof are narrowed, the distal ends lying parallel with one another. The outwardly extending corner portions 35 are provided on the outer sides of the outermost metal terminals 30 at the portions thereof where the terminal spacing begins to narrow. The total width L, of all ten of the metal terminals 30 where the spacing thereof is narrowed is set to be approximately the same as the width $L_3$ of the insertion hole 71 (see FIGS. 6(a)-6(e)) of the connector 70 into which the metal terminals 30 are inserted to make a connection. Further, the outer sides of the two outermost metal terminals 30 are provided with arcuate curved portions 39 near the tips thereof.

The reinforcing film 50, which is made of a material the same as that constituting the resin film 13 constructing the flexible printed circuit board 10, is formed to have a size large enough to cover the connection portions 37 of the metal terminals 30.

Figure 3:
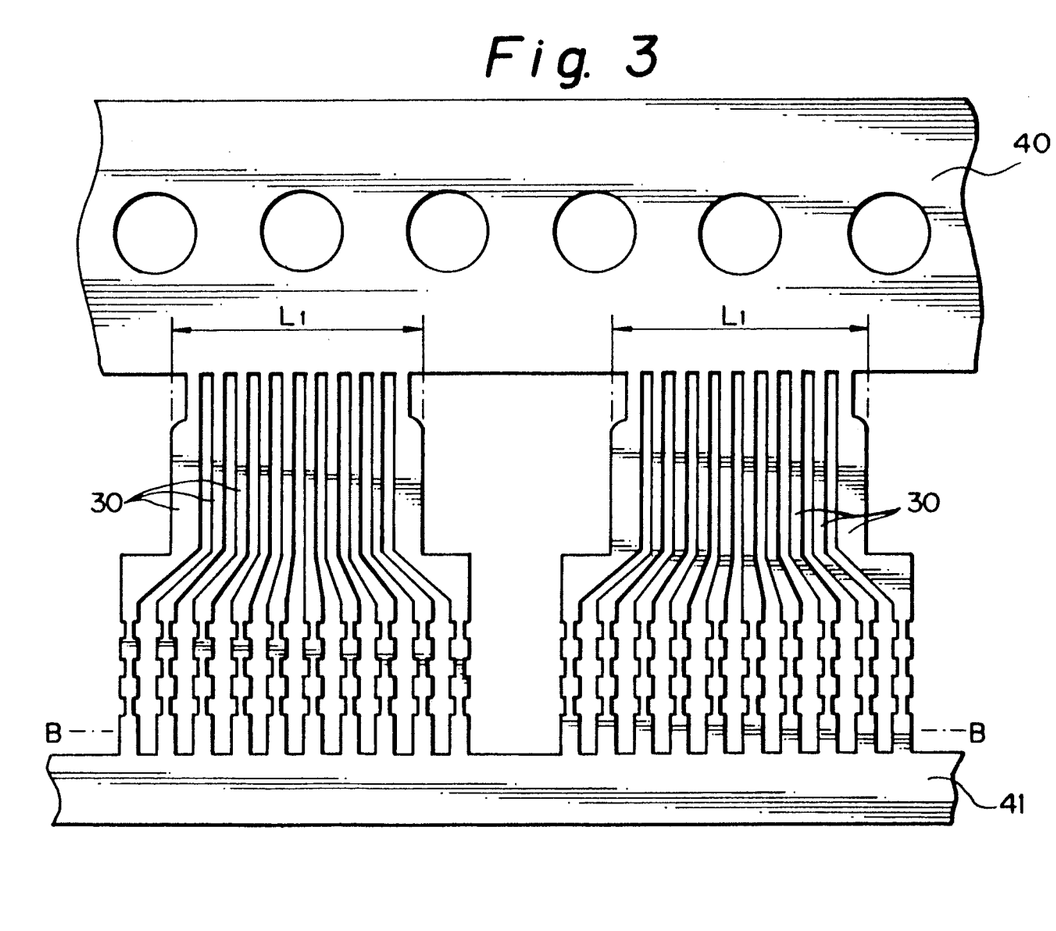
FIGS. 3, 4 and 5 are plan views for describing a method of manufacturing the terminal structure of the flexible printed circuit board according to the present invention.
Figure 4:
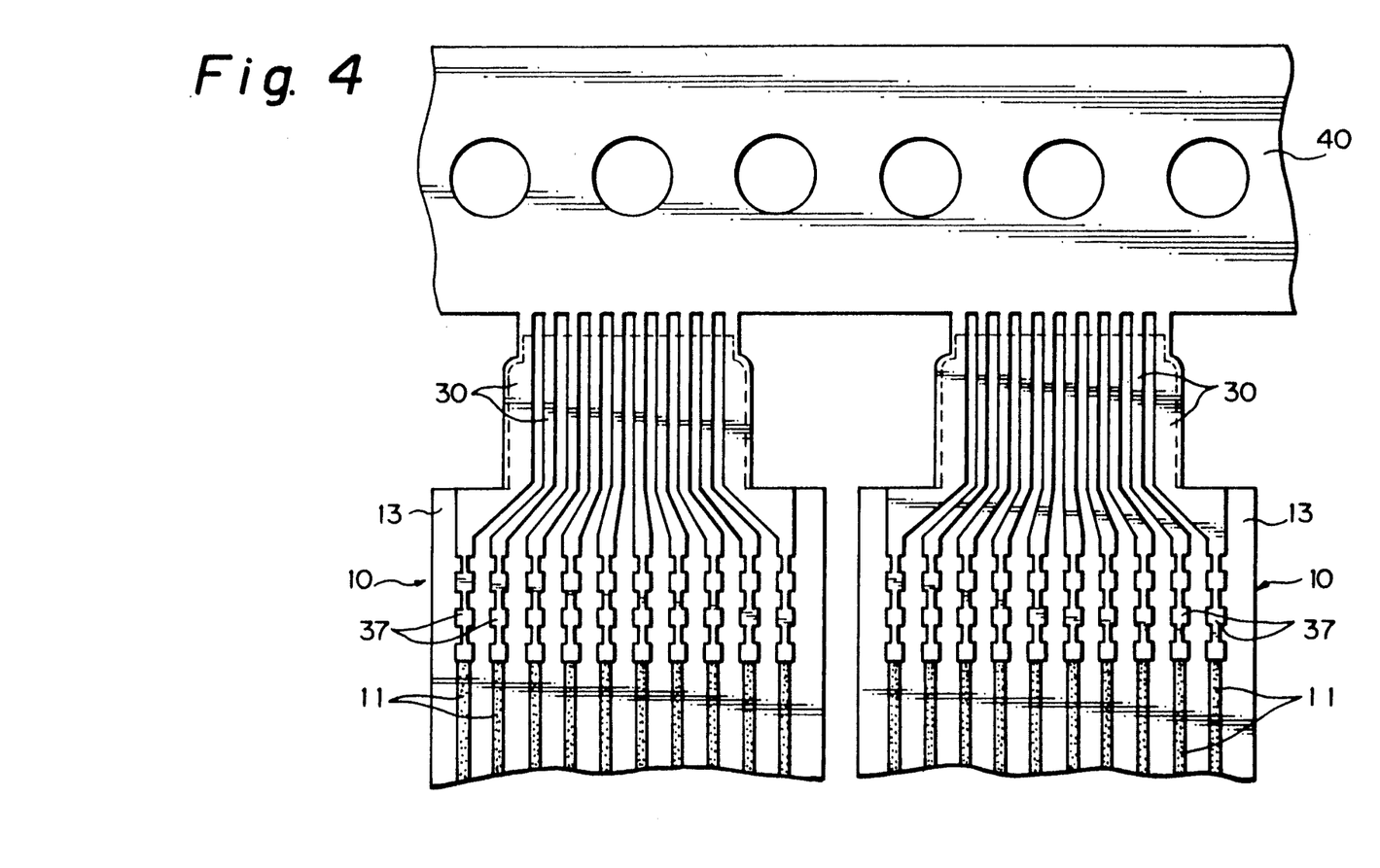
Figure 5:
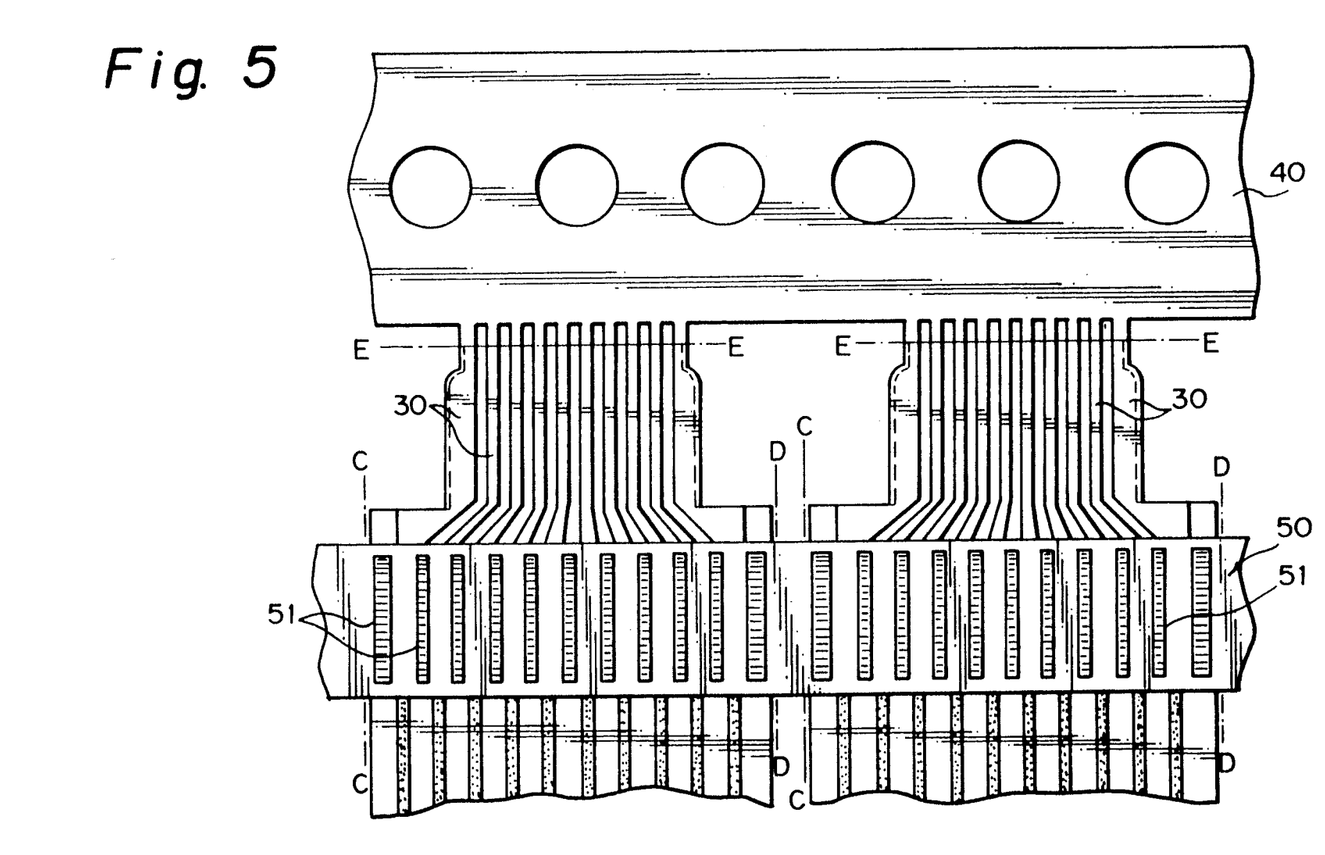

FIGS. 3 through 5 are diagrams for describing a method of manufacturing the terminal structure of the flexible printed circuit board.

First, as shown in FIG. 3, groups of ten metal terminals 30 each are formed continuously at predetermined intervals by press-cutting machining with both of their ends connected to two parallel connecting strips 40, 41. The metal terminals 30 are then cut along line B—B in FIG. 3. Since all of the metal terminals 30 are secured to the connecting strip 40, the overall width $L_1$ of the ten metal terminal 30 and the spacing between the individual metal terminals 30 are precise.

Next, as illustrated in FIG. 4, the wiring patterns 11 of the flexible printed circuit board 10 are disposed beneath the connection portions 37 of the ten metal terminals 30 in each group and the two are bonded together via a hot-melt electrically conductive bonding agent. An insulative adhesive is used to adhere the metal terminals 30 to the flexible printed circuit board 10 at the portions thereof where the electrically conductive bonding agent is not provided. As a result, each metal terminal 30 will be affixed to the resin film 13 up to its tip, and the connection portion 37 of each metal terminal 30 will be bonded to the tip of the corresponding electrically conductive pattern 11 so as to be capable of conducting electrically. Since the width $L_2$ (see FIG. 2) of the connector insertion portion 15 of resin film 13 is slightly less than the width $L_1$ (FIG. 2) of all ten of the metal terminals 30, as mentioned above, the terminal retaining part of the connector insertion portion 15 will not protrude from the sides of the outermost metal terminals 30. The metal terminals 30 are affixed to the connection insertion portion 15 of the flexible printed circuit board 10 while the overall width $L_1$ of the ten metal terminals 30 and the spacing between the individual metal terminals are accurately maintained.

Next, as depicted in FIG. 5, the strip-shaped reinforcing film 50 is placed upon the connection portions 37 (see FIG. 4) of the metal terminals 30, and portions 51 between the connection portions 37 of the metal terminals 30 are melted locally from above by means of ultrasonic heating so that the reinforcing film 50 and the resin film 13 are thermally fused together. As a result, the connection portions 37 of the metal terminals 30 are strongly secured between the reinforcing film 50 and the resin film 13. Next, a heating iron is pressed against the reinforcing film from above to melt the electrically conductive bonding agent so that an electrical connection is achieved between the connection portions 37 of the metal terminals 30 and the electrically conductive patterns 11. It should be noted that there are various other methods of connecting and fixing the metal terminals 30 to the electrically conductive patterns 11 of the flexible printed circuit board 10, and any of these methods may be employed for this purpose.

When cutting is performed along lines C—C, D—D and E—E in FIG. 5, the terminal structure of the flexible printed circuit board shown in FIG. 1 is completed.

Figures 6A, 6B:
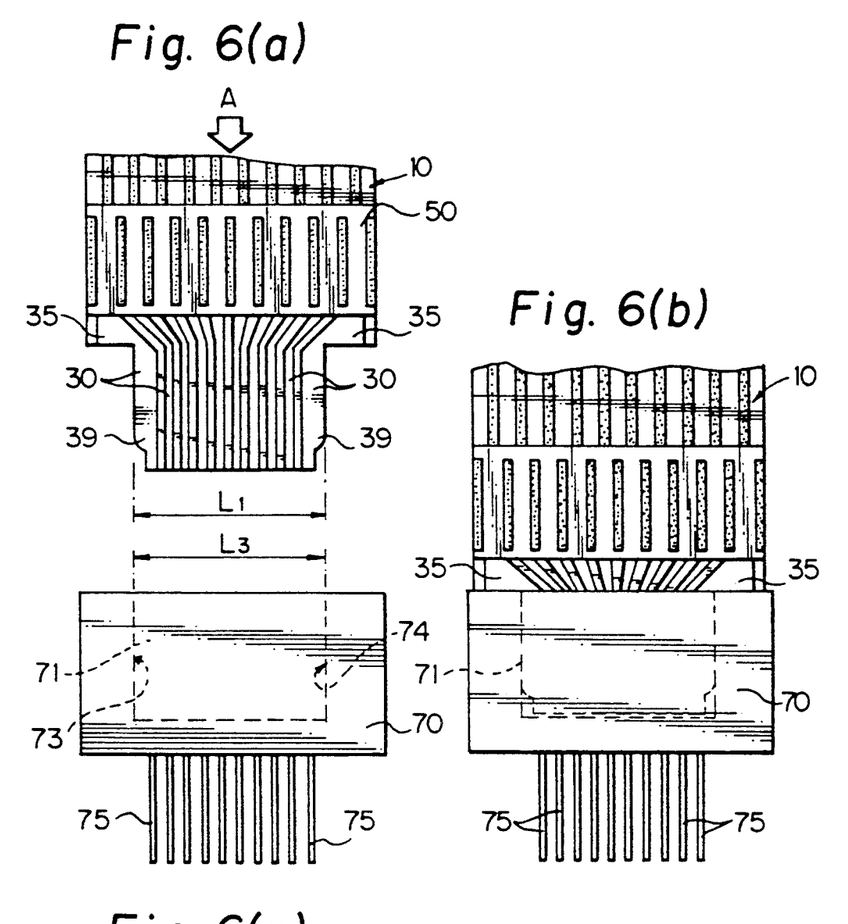
FIG. 6(a) is a front view showing the flexible printed circuit board before it is inserted.
FIG. 6(b) is a front view showing the flexible printed circuit board after it is inserted.
Figure 6C:
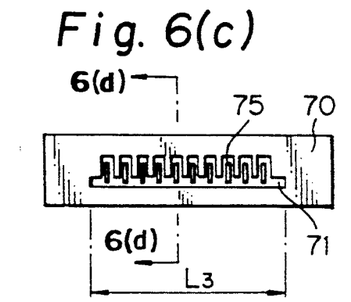
FIG. 6(c) is a plan view showing solely the connector.
Figure 6D:
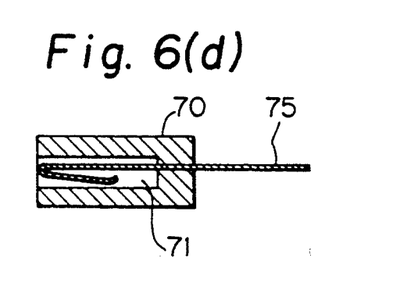
FIG. 6(d) is a sectional view taken along line 6d—6d in FIG.
Figure 6E:
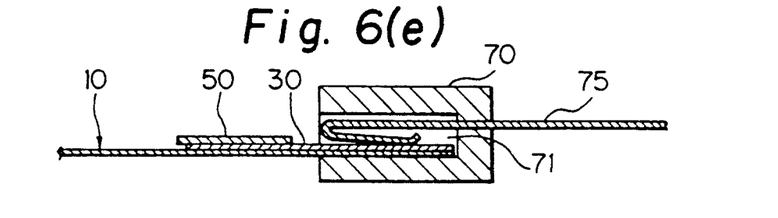

FIGS. 6(a)-6(e) show a method of connecting a flexible printed circuit board 10, to which the metal terminals 30 have been secured, to a connector 70, in which FIG. 6(a) is a front view showing the flexible printed circuit board 10 before it is inserted. FIG. 6(b) is a front view showing the flexible printed circuit board 10 after it is inserted, FIG. 6(c) is a plan view showing solely the connector 70, FIG. 6(d) is a sectional view taken along line 6d—6d in FIG. 6(c), and FIG. 6(e) is a sectional view showing the flexible printed circuit board 10 after it is inserted into the connector 70.

As illustrated in FIGS. 6(a) and 6(c), the connector 70 is provided with the insertion hole 71 for receiving the inserted metal terminals 30, which are provided on the end of the flexible printed circuit board 10. The width $L_3$ of the insertion hole 71 is set to be slightly larger than the total width $L_1$ of all of the metal terminals 30 in order to provide some play. Ten terminals 75, each of which comprises a resilient metal plate for coming into resilient contact with a corresponding metal terminal 30, are mounted in the insertion hole 71.

As shown in FIG. 6(a), when the metal terminals 30 provided on the end of the flexible printed circuit board 10 are inserted into the insertion hole 71 of the connector 70 so that the corner portions 35, 35 provided on the outermost metal terminals 30 come into abutting contact with both side portions of the entrance to the insertion hole 71 of the connector 70, the operation for connecting the flexible printed circuit board 10 to the connector 70 is completed. At such time the metal terminals 30 are in resilient contact with the corresponding connection terminals 75 of connector 70 and are electrically connected thereto, as illustrated in FIG. 6(e).

Since the single layer of resin film 13 (the connector insertion portion 15) has been affixed to the undersides of the metal terminals 30 (see FIG. 2), the tips of the metal terminals 30 are situated in the same plane without becoming misaligned. As a result, the insertion of the connector insertion portion 15, to which the metal terminals 30 have been attached, into the insertion hole 71 of the connector 70 is performed smoothly.

Further, the outermost metal terminals 30 are provided with the curved portions 39, as shown in FIG. 1. Accordingly, when the metal terminals 30 are inserted into the insertion hole 71 of the connector 70, the curved portions 39 will come into abutting contact with portions of the insertion hole 71 on both side walls 73, 74 thereof, even if the insertion positions of the metal terminals 30 are offset slightly in the width direction, as long as the distal ends of the metal terminals 30 are capable of being inserted. By virtue of this abutting contact, the positions of the metal terminals 30 relative to the insertion hole 71 are corrected at insertion, as a result of which insertion is facilitated.

As shown in FIGS. 1 and 2, the connector insertion portion 15, which is part of the resin film 13, is affixed to the undersides of the metal terminals 30. However, the width $L_2$ of the connector insertion portion 15 is designed to be slightly less than the total width $L_1$ of all of the metal terminals 30. Accordingly, what comes into abutting contact with the two side walls 73, 74 of the insertion hole 71 of the connector 70 shown in FIG. 6(a) are the outer side surfaces of the outermost metal terminals 30. In other words, the highly rigid metal terminals 30 themselves are utilized for guiding purposes at insertion into the insertion hole 71 of the connector 70, and therefore the insertion operation is facilitated and made more reliable.

In the present invention, the outermost metal terminals 30 are provided with the corner portions 35. Therefore, when the metal terminals 30 have been inserted into the insertion hole 71 of the connector 70 as shown in FIG. 6(b), the corner portions 35 come into abutting contact with both side portions of the entrance to the insertion hole 71. More specifically, once the corner portions 35 have been brought into abutting contact with both side portions of the entrance to the insertion hole 71, the flexible printed circuit board 10 will be perfectly seated within the connector 70 and the amount of insertion will always be the proper amount.

Further, the metal terminals 30 are fixedly bonded to the resin film 13, after they have been press-cut by a press, while the tips of the terminals are in a connected state. As a result, distances $l_5$, $l_6$, (FIG. 1) from the outer sides of the outermost metal terminals 30 to the centers of the neighboring metal terminals 30 become exactly equal ($l_5 = l_6$), and the spaces $l_4$ between the metal terminals 30 are all rendered perfectly uniform. Moreover, the outer sides of the outermost metal terminals 30 serve directly as guides at insertion into the insertion hole 71 of the connector 70. As a result, when the metal terminals 30 are inserted into the insertion hole 71 of connector 70, each metal terminal 30 is accurately connected to the connection terminal 75 within the connector 70.

Second Embodiment

Figure 7:
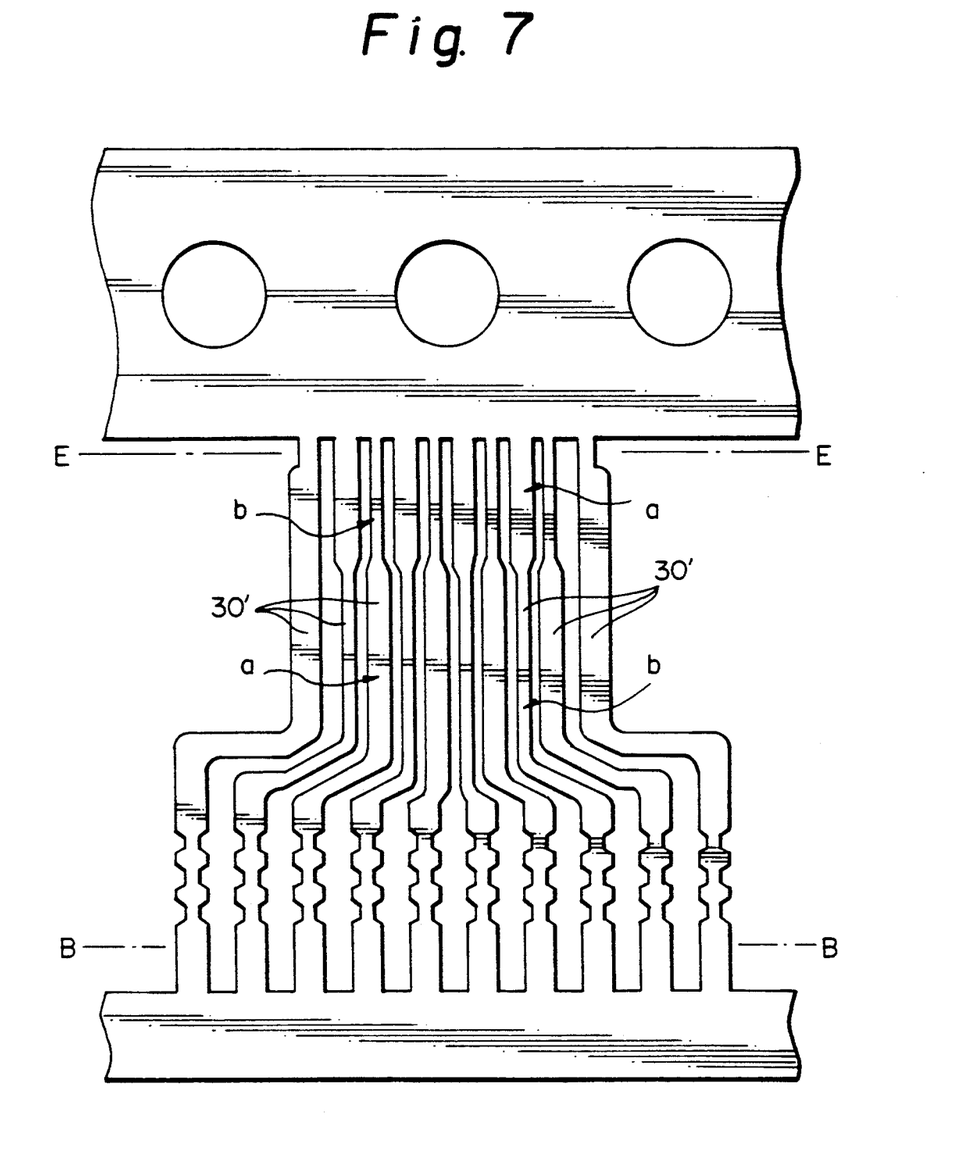
FIG. 7 is a plan view showing metal terminals, which are used in a second embodiment of the present invention, in a state press-cut from a metal plated by press-cut machining.

FIG. 7 illustrates metal terminals 30', which are used in a second embodiment of the present invention, in a state in which they have been press-cut from a metal plate by press-cutting work. Except for the shape of the metal terminals 30', this embodiment is identical with the first embodiment. Accordingly, only the shape of the metal terminals 30' will be described.

Specifically, the metal terminals 30' used in this embodiment are provided with a longitudinally extending portion a of comparatively large width and a longitudinally extending portion b of comparatively small width on the distal ends thereof that are inserted into the insertion hole of the connector. The metal terminals 30' are disposed a staggered fashion in such a manner that the portions a and b alternate with each other. The portions a of enlarged width are made to serve as surfaces of contact with respective ones of the connection terminals (not shown) within the connector 70 shown in FIG. 6(a)-6(e). It goes without saying that the portions of the connection terminals within the connector 70 that contact the metal terminals 30' also are required to be arranged in alternating fashion correspondingly.

If the metal terminals 30' are thus arranged and constructed and the spaces between the metal terminals 30' are made the same as the spaces between the metal terminals 30 of the first embodiment, the area of contact (the area of the portion a) with the connection terminals in the connector 70 can be enlarged in comparison with the metal terminals 30 of the first embodiment. Accordingly, some dimensional margin can be provided with regard to the connection to the connection terminals of the connector 70, and therefore the dimensional precision of the metal terminals 30' can be somewhat coarse. Conversely, if the area of contact with the connection terminals of the connector 70 is made the same as that of the metal terminals 30 of the first embodiment (that is, if the width of the broad portions a of the metal terminals 30' is made the same as the width of the metal terminals 30 of the first embodiment), the spacing of the metal terminals 30' can be reduced in comparison with the metal terminals 30 of the first embodiment. As a result, the terminal structure can be made smaller. On the other hand, if the total width of all of the metal terminals 30' is made the same as the total width of all of the metal terminals 30, the number of the metal terminals 30' can be increased.

Third Embodiment

Figure 8:
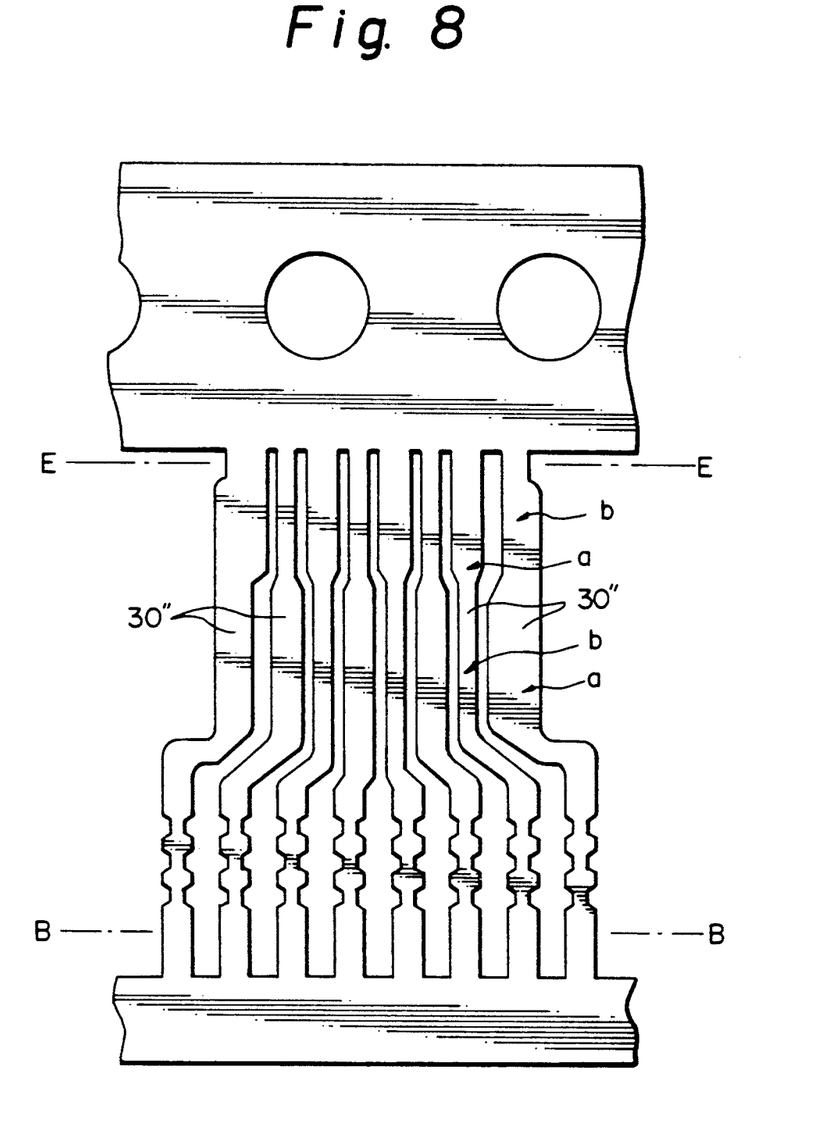
FIG. 8 is a plan view showing metal terminals, which are used in a third embodiment of the present invention, in a state press-cut from a metal plate by press-cut machining.

FIG. 8 illustrates metal terminals 30", which are used in a third embodiment of the present invention, a state in which they have been press-cut from a metal plate by press-cutting work.

The metal terminals 30" used in this embodiment also are provided with a longitudinally extending portion a of comparatively large width and a longitudinally extending portion b of comparatively small width on the distal ends thereof that are inserted into the insertion hole of the connector, and the metal terminals 30" are disposed a staggered fashion in such a manner that the portions a and b alternate with each other. In the third embodiment, unlike the second embodiment, the outermost metal terminals 30" also are provided with the portions a and b of large and small width, respectively. The portions a of enlarged width are made to sever as surfaces of contact with respective ones of the connection terminals (not shown) within the connector 70 shown in FIG. 6.

If the outermost metal terminals 30" are thus provided with the portions a and b of large and small width, respectively, the spacing between the metal terminals 30" can be reduced correspondingly. Thus, effects can be obtained that exceed those of the second embodiment.

The number of metal terminals provided with the portions of enlarged and reduced width is not limited to that of the second and third embodiments; any number of the total number of metal terminals can be provided with these portions.

The terminal structure for a flexible printed circuit board according to the present invention, the details of which have been described above, provides the following outstanding effects:

(1) The distal ends of the metal terminals do not become misaligned when the metal terminals are connected to the end of the flexible printed circuit board. This facilitates insertion of the metal terminals into the insertion hole of the connector.

(2) In terms of structure, the plurality of metal terminals used in the present invention are placed upon the flexible printed circuit board in a parallel fashion. More specifically, the structure is such that the metal terminals are cut by press-cutting work while in a state in which the distal ends of the terminals are connected, and the metal terminals are placed upon and secured to a resin film. As a result, the spacing of the metal terminals can be rendered constant with good accuracy, and the distances from the outer sides of the outermost metal terminals to the neighboring metal terminals also can be made constant with good accuracy. Moreover, the outer sides of the outermost metal terminals serve directly as guides when the terminals are inserted into the insertion hole of the connector. As a result, the metal terminals can be accurately connected to the corresponding connection terminals within the connector when the metal terminals are inserted into the connector.

(3) Since the outermost metal terminals are provided with respective corner portions, the flexible printed circuit board can always be inserted straight into the connector, and the amount of insertion is always the proper amount.

(4) Since the outer surfaces of the highly rigid metal terminals themselves serve as guides for insertion of the metal terminals into the connector, the insertion operation is facilitated and made more reliable.

(5) The ends of the metal terminals on the side of reduced terminal spacing are connected to the connector, while the ends of the metal terminals on the side where terminal spacing is not reduced are connected to the electrically conductive patterns on the flexible printed circuit board. This means that even if the connector is reduced in size, the spaces between the metal terminals on the side connected to the electrically conductive patterns can be enlarged. Accordingly, it is possible to make a connection to a miniaturized connector even though the metal terminals are connected to the flexible printed circuit board.

(6) In a case where the metal terminals are provided with portions of enlarged and reduced width and the portions of enlarged width are disposed a staggered fashion, the area of contact with the corresponding connection terminals in the connector can be enlarged, thereby facilitating the connection between the two terminals. Conversely, in a case where the contact area is not enlarged, the spacing of the metal terminals can be reduced.

As many apparently widely different embodiments of the present invention can be made without departing from the spirit and scope thereof, it is to be understood that the invention is not limited to the specific embodiments thereof except as defined in the appended claims.

We claim:

1. A terminal structure of a flexible printed circuit board, comprising:
    a flexible printed circuit board including a resin film, and a plurality of electrically conductive patterns provided on said resin film, a prescribed part of the resin film having a connector insertion portion of a width substantially the same as that of an insertion hole of a connector; and
    a plurality of meal terminals each consisting of a slender, elongate metal plate;
    said plurality of metal terminals being disposed in parallel on said flexible printed circuit board, distal ends of said terminals being situated adjacent a distal end of the connector insertion portion of said flexible printed circuit board;
    each metal terminal being fixedly bonded to a respective one of the electrically conductive patterns provided on said flexible printed circuit board; and
    the connector insertion portion of said flexible printed circuit board to which said metal terminals are attached having such a width that said connector insertion portion does not extend beyond outer sides of outermost ones of said metal terminals located along opposing longitudinal edges of said connector insertion portion.

2. The terminal structure according to claim 1, wherein portions of said metal terminals on a leading-end side thereof for insertion into the insertion hole of the connector are formed that spaces between mutually adjacent ones of said metal terminals at these portions are parallel and smaller than spaces between mutually adjacent ones of said metal terminals at portions on a trailing-end side thereof where they are fixedly bonded to the electrically conductive patterns, and the outer sides of said outermost metal terminals are provided with respective corner portions for coming into abutting contact with and being positioned by both sides of an entrance to the insertion hole of the connector when said metal terminals are inserted into said insertion hole.

3. The terminal structure according to claim 1 wherein prescribed metal terminals among said plurality of metal terminals are each provided with a longitudinally extending portion of comparatively large width and a longitudinally extending portion of comparatively small width, and said portions of comparatively large width are disposed in a staggered fashion and made to serve as surfaces of contact with respective ones of the connection terminals of the connector.

4. The terminal structure according to claim 2, wherein prescribed metal terminals among said plurality of metal terminals are each provided with a longitudinally extending portion of comparatively large width and a longitudinally extending portion of comparatively small width, and said portions of comparatively large width are disposed in a staggered fashion and made to serve as surfaces of contact with respective ones of the connection terminals of the connector.

* * * * *